United States Patent
Ohkubo et al.

(10) Patent No.: US 7,417,277 B2
(45) Date of Patent: Aug. 26, 2008

(54) SEMICONDUCTOR INTEGRATED CIRCUIT AND METHOD OF MANUFACTURING THE SAME

(75) Inventors: Hiroaki Ohkubo, Kanagawa (JP); Yasutaka Nakashiba, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 19 days.

(21) Appl. No.: 11/607,000

(22) Filed: Dec. 1, 2006

(65) Prior Publication Data

US 2007/0126031 A1      Jun. 7, 2007

(30) Foreign Application Priority Data

Dec. 2, 2005     (JP)      ............................. 2005-349011

(51) Int. Cl.
*H01L 27/108*     (2006.01)
(52) U.S. Cl. ..................... 257/312; 257/300; 257/305; 257/336; 257/403; 257/E29.345
(58) Field of Classification Search .............. 257/300, 257/305, 312, 336, 403, E29.345
See application file for complete search history.

(56) References Cited

U.S. PATENT DOCUMENTS

| | | | | |
|---|---|---|---|---|
| 6,121,650 A | * | 9/2000 | Akamatsu | ................... 257/296 |
| 6,291,307 B1 | * | 9/2001 | Chu et al. | ................... 438/393 |
| 7,176,530 B1 | * | 2/2007 | Bulucea et al. | ............. 257/369 |

FOREIGN PATENT DOCUMENTS

| | | |
|---|---|---|
| JP | 2001-044283 | 2/2001 |
| JP | 2004-055954 | 2/2004 |

* cited by examiner

*Primary Examiner*—Andy Huynh
(74) *Attorney, Agent, or Firm*—McGinn IP Law Group, PLLC

(57) ABSTRACT

Conventional capacitors constituted of a FET incur degradation in frequency response. A semiconductor integrated circuit includes a semiconductor substrate, an N-type FET, a P-type FET, and capacitors. The N-type FET includes N-type impurity diffusion layers, a P-type impurity-implanted region, a gate insulating layer, and a gate electrode. The P-type FET includes P-type impurity diffusion layers, an N-type impurity-implanted region, a gate insulating layer, and a gate electrode. The capacitor includes N-type impurity diffusion layers, an N-type impurity-implanted region, a capacitance insulating layer, and an upper electrode. The capacitor includes P-type impurity diffusion layers, a P-type impurity-implanted region, a capacitance insulating layer, and an upper electrode.

14 Claims, 5 Drawing Sheets

SEMICONDUCTOR INTEGRATED CIRCUIT AND METHOD OF MANUFACTURING THE SAME

This application is based on Japanese patent application No. 2005-349011, the content of which is incorporated hereinto by reference.

BACKGROUND

1. Technical Field

The present invention relates to a semiconductor integrated circuit and a method of manufacturing the same.

2. Related Art

An example of semiconductor integrated circuits so far developed can be found in Japanese Laid-open patent publication No. 2004-55954. In the semiconductor integrated circuit according to this document, a capacitor is provided as a fill-cell capacitance in a region where a functional cell (logic gate cell) is not located.

Generally, the capacitor in the semiconductor integrated circuit is often constituted of a field effect transistor (hereinafter, FET). Specifically, electrically connecting the source terminal and drain terminal of the FET as shown in FIG. 5 enables utilizing the gate electrode, the gate insulating layer and the channel region of the FET as the upper electrode, the capacitance insulating layer and the lower electrode capacitor of the capacitor, respectively. Here, the FET in FIG. 5 is provided between a power source (VDD) and a ground (GND), so as to act as a decoupling capacitance.

Also, Japanese Laid-open patent publication No. 2001-44283 discloses a semiconductor integrated circuit including a fill-cell in which a fill-cell resistance is provided.

In the capacitor constituted of the FET, however, the path from the channel region (lower electrode) to the source/drain region has a high electrical resistance. This path is where a charge flowing into and out of the lower electrode runs through. The high electrical resistance in this path, therefore, leads to degradation in frequency response of the capacitor.

From the viewpoint of improving the frequency response, reducing the length of the gate electrode (gate length) would be a solution. In this case, however, the electrode area of the capacitor is inevitably reduced, which incurs another problem that the capacitance value is decreased.

SUMMARY OF THE INVENTION

According to the present invention, there is provided a semiconductor integrated circuit comprising a semiconductor substrate, a field effect transistor, and a capacitor; wherein the field effect transistor includes a first impurity diffusion layer of a first conductive type provided in the semiconductor substrate and acting as a source/drain region, a first impurity-implanted region of a second conductive type provided in the semiconductor substrate and adjacent to the first impurity diffusion layer, and acting as a channel region, a gate insulating layer provided on the first impurity-implanted region in the semiconductor substrate, and a gate electrode provided on the gate insulating layer; and the capacitor includes a second impurity diffusion layer of the first or the second conductive type provided in the semiconductor substrate, a second impurity-implanted region of the same conductive type as the second impurity diffusion layer, provided in the semiconductor substrate and adjacent to the second impurity diffusion layer, and acting as a lower electrode, a capacitance insulating layer provided on the second impurity-implanted region of the semiconductor substrate, and an upper electrode provided on the capacitance insulating layer. Here, the first conductive type and the second conductive type are mutually opposite conductive types, and one is N-type and the other is P-type.

In the semiconductor integrated circuit thus constructed, the conductive type of the second impurity diffusion layer and that of the second impurity-implanted region acting as the lower electrode are the same. Under such configuration, electrical resistance of a path from the second impurity-implanted region to the second impurity diffusion layer is smaller, compared with the case where the conductive type is different. Consequently, the capacitor attains superior frequency response.

According to the present invention, there is also provided a method of manufacturing a semiconductor integrated circuit including a semiconductor substrate, a field effect transistor and a capacitor, comprising forming a first impurity diffusion layer of a first conductive type in the semiconductor substrate, thus constituting a source/drain region; forming a first impurity-implanted region of a second conductive type in the semiconductor substrate and adjacent to the first impurity diffusion layer, thus constituting a channel region; forming a gate insulating layer on the first impurity-implanted region in the semiconductor substrate; forming a gate electrode on the gate insulating layer; forming a second impurity diffusion layer of the first or the second conductive type in the semiconductor substrate; forming a second impurity-implanted region of the same conductive type as the second impurity diffusion layer, in the semiconductor substrate and adjacent to the second impurity diffusion layer, thus constituting a lower electrode; forming a capacitance insulating layer on the second impurity-implanted region of the semiconductor substrate, and forming an upper electrode on the capacitance insulating layer.

By the method thus arranged, the second impurity diffusion layer and the second impurity-implanted region of the same conductive type are provided. Because of such arrangement, electrical resistance of a path from the second impurity-implanted region to the second impurity diffusion layer is smaller, compared with the case where the conductive type is different. Consequently, the capacitor attains superior frequency response.

Thus, the present invention provides a semiconductor integrated circuit including a capacitor that offers excellent frequency response performance, and a method of manufacturing such semiconductor integrated circuit.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
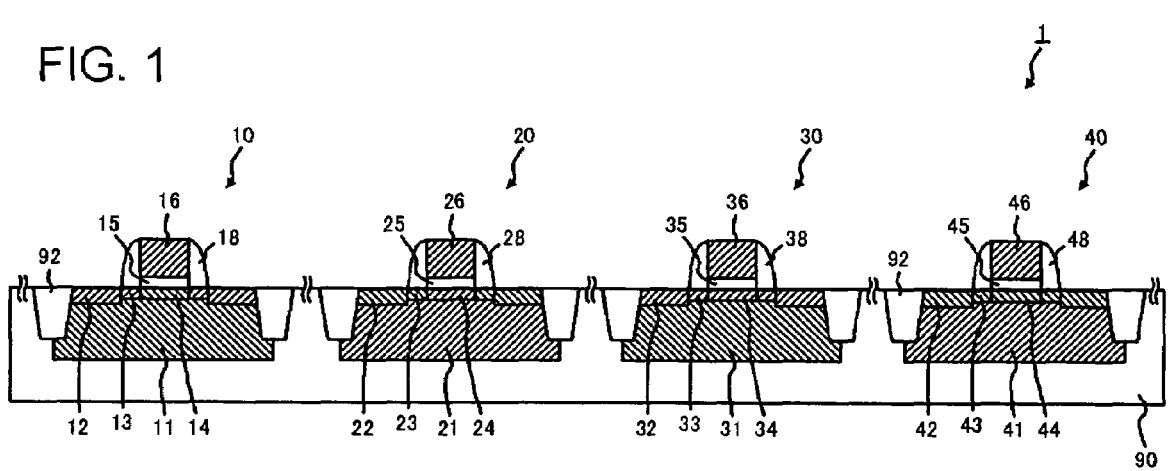
FIG. 1 is a cross-sectional view showing a semiconductor integrated circuit according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor integrated circuit and a method of manufacturing the same according to the present invention will be described in details, referring to the accompanying drawings. In the drawings, same constituents are given the same numerals, and the description thereof will not be repeated.

First Embodiment

FIG. 1 is a cross-sectional view showing the semiconductor integrated circuit according to a first embodiment of the present invention. The semiconductor integrated circuit 1 includes a semiconductor substrate 90, an N-type FET 10, a P-type FET 20, and capacitors 30, 40. The semiconductor substrate 90 is, for example, a silicon substrate.

The N-type FET 10 includes N-type impurity diffusion layers 12, 13, a P-type impurity-implanted region 14, a gate insulating layer 15, and a gate electrode 16. The N-type impurity diffusion layers 12, 13 are provided in the semiconductor substrate 90, and serve as the source/drain region of the N-type FET 10. Out of the N-type impurity diffusion layers 12, 13, the N-type impurity diffusion layer 13 corresponds to a Lightly Doped Drain (hereinafter, LDD) region. In the semiconductor substrate 90, the P-type impurity-implanted region 14 is provided adjacent to the N-type impurity diffusion layer 13. The P-type impurity-implanted region 14 serves as the channel region of the N-type FET 10. The N-type impurity diffusion layers 12, 13 and the P-type impurity-implanted region 14 are located in a P-type well region 11 in the semiconductor substrate 90.

On the P-type impurity-implanted region 14 in the semiconductor substrate 90, the gate insulating layer 15 is provided. On the gate insulating layer 15, the gate electrode 16 is provided. The gate insulating layer 15 and the gate electrode 16 are constituted of, for instance, silicon oxide and polysilicon respectively. Further on a lateral face of the gate electrode 16, a sidewall 18 is provided.

The P-type FET 20 includes P-type impurity diffusion layers 22, 23, an N-type impurity-implanted region 24, a gate insulating layer 25, and a gate electrode 26. The P-type impurity diffusion layers 22, 23 are provided in the semiconductor substrate 90, and serve as the source/drain region of the P-type FET 20. Out of the P-type impurity diffusion layers 22, 23, the P-type impurity diffusion layer 23 corresponds to a LDD region. In the semiconductor substrate 90, an N-type impurity-implanted region 24 is provided adjacent to the P-type impurity diffusion layer 23. The N-type impurity-implanted region 24 serves as the channel region of the P-type FET 20. The P-type impurity diffusion layers 22, 23 and the N-type impurity-implanted region 24 are located in an N-type well region 21 in the semiconductor substrate 90.

On the N-type impurity-implanted region 24 in the semiconductor substrate 90, the gate insulating layer 25 is provided. On the gate insulating layer 25, the gate electrode 26 is provided. The gate insulating layer 25 and the gate electrode 26 are constituted of the same material as the gate insulating layer 15 and the gate electrode 16. Further on a lateral face of the gate electrode 26, a sidewall 28 is provided.

The capacitor 30 includes N-type impurity diffusion layers 32, 33, an N-type impurity-implanted region 34, a capacitance insulating layer 35, and an upper electrode 36. The N-type impurity diffusion layers 32, 33 are located in the semiconductor substrate 90. The N-type impurity diffusion layers 32, 33 constitute a path for a charge flowing into the N-type impurity-implanted region 34 (or flowing out of the N-type impurity-implanted region 34). In this embodiment, the N-type impurity diffusion layer 32 and the N-type impurity diffusion layer 33 have generally the same impurity concentration profile as the N-type impurity diffusion layer 12 and the N-type impurity diffusion layer 13 of the N-type FET 10, respectively.

In the semiconductor substrate 90, the N-type impurity-implanted region 34 is provided adjacent to the N-type impurity diffusion layer 33. The N-type impurity-implanted region 34 serves as the lower electrode of the capacitor 30. Also, the conductive type of the N-type impurity-implanted region 34 is the same as that of the N-type impurity diffusion layers 32, 33. In this embodiment, the N-type impurity-implanted region 34 has generally the same impurity concentration profile as the N-type impurity-implanted region 24 of the P-type FET 20. The N-type impurity diffusion layers 32, 33 and the N-type impurity-implanted region 34 are located in a P-type well region 31 in the semiconductor substrate 90. Here, the P-type well region 31 may be integrally formed with the P-type well region 11.

On the N-type impurity-implanted region 34 in the semiconductor substrate 90, the capacitance insulating layer 35 is provided. On the capacitance insulating layer 35, the upper electrode 36 is provided. The capacitance insulating layer 35 is constituted of the same material as the gate insulating layers 15, 25. Also, the capacitance insulating layer 35 has generally the same thickness as the gate insulating layers 15, 25. Likewise, the upper electrode 36 is constituted of the same material as the gate electrodes 16, 26. Also, the upper electrode 36 has generally the same thickness as the gate electrodes 16, 26. Further, on a lateral face of the upper electrode 36, a sidewall 38 is provided.

The capacitor 40 includes P-type impurity diffusion layers 42, 43, a P-type impurity-implanted region 44, a capacitance insulating layer 45, and an upper electrode 46. The P-type impurity diffusion layers 42, 43 are located in the semiconductor substrate 90. The P-type impurity diffusion layers 42, 43 constitute a path for a charge flowing into the P-type impurity-implanted region 44 (or flowing out of the P-type impurity-implanted region 44). In this embodiment, the P-type impurity diffusion layer 42 and the P-type impurity diffusion layer 43 have generally the same impurity concentration profile as the P-type impurity diffusion layer 22 and the P-type impurity diffusion layer 23 of the P-type FET 20, respectively.

In the semiconductor substrate 90, the P-type impurity-implanted region 44 is provided adjacent to the P-type impurity diffusion layer 43. The P-type impurity-implanted region 44 serves as the lower electrode of the capacitor 40. Also, the conductive type of the P-type impurity-implanted region 44 is the same as that of the P-type impurity diffusion layers 42, 43. In this embodiment, the P-type impurity-implanted region 44 has generally the same impurity concentration profile as the P-type impurity-implanted region 14 of the N-type FET 10. The P-type impurity diffusion layers 42, 43 and the P-type impurity-implanted region 44 are located in an N-type well region 41 in the semiconductor substrate 90. Here, the N-type well region 41 may be integrally formed with the N-type well region 21.

On the P-type impurity-implanted region 44 in the semiconductor substrate 90, the capacitance insulating layer 45 is provided. On the capacitance insulating layer 45, the upper electrode 46 is provided. The capacitance insulating layer 45 is constituted of the same material as the gate insulating layers 15, 25. Also, the capacitance insulating layer 45 has generally the same thickness as the gate insulating layers 15, 25. Likewise, the upper electrode 46 is constituted of the same material as the gate electrodes 16, 26. Also, the upper electrode 46 has generally the same thickness as the gate electrodes 16, 26. Further, on a lateral face of the upper electrode 46, a sidewall 48 is provided.

It should be noted that although the N-type impurity diffusion layers 32, 33 are provided on both sides of the N-type impurity-implanted region 34 in the capacitor 30, the N-type impurity diffusion layers 32, 33 on one of the sides are electrically connected to the N-type impurity diffusion layers 32, 33 on the other side, via an interconnect or the like not shown in FIG. 1. This is also the case with the P-type impurity diffusion layers 42, 43 in the capacitor 40.

The N-type FET 10, the P-type FET 20, the capacitor 30 and the capacitor 40 are isolated from one another by an isolation region 92. The isolation region 92 is a Shallow Trench Isolation (STI) region, for example.

Figure 2:
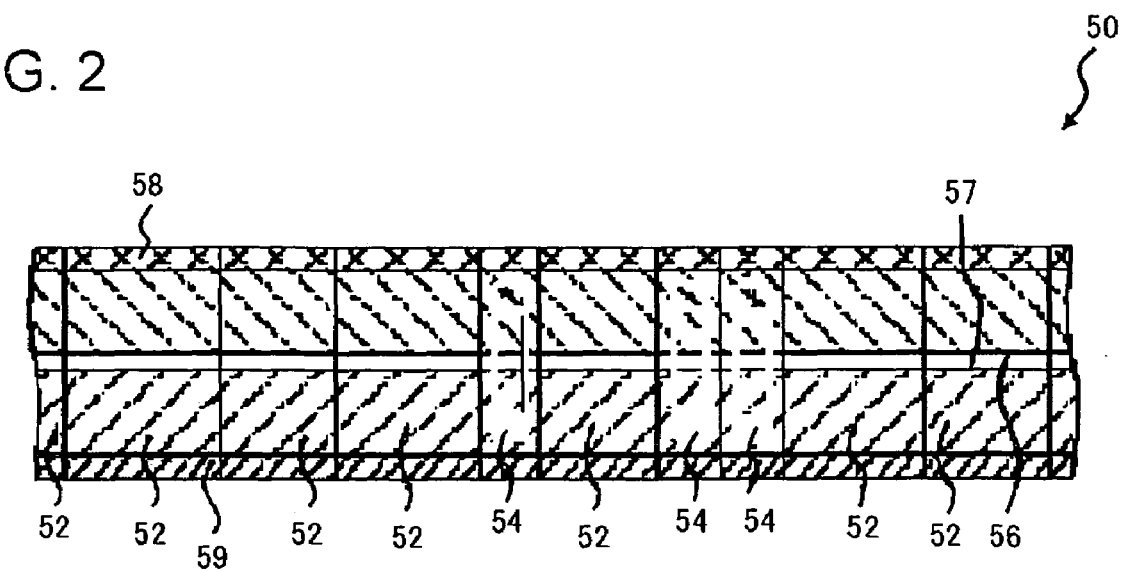
FIG. 2 is a plan view showing a fill-cell.

The N-type FET 10, the P-type FET 20, the capacitor 30 and the capacitor 40 are, for example, formed in a fill-cell. FIG. 2 is a plan view showing the fill-cell. The fill-cell 50 includes functional cells 52 and capacitance fill-cells 54. The capacitance fill-cells 54 are located so as to fill in a region in the fill-cell 50 where the functional cells 52 are not provided. Here, the N-type FET 10 and the P-type FET 20 may be employed as the FETs constituting the functional cells 52, and the capacitor 30 and the capacitor 40 may be employed as the fill-cell capacitance constituting the capacitance fill-cell 54.

Also, in the fill-cell 50, an N-type well region 56 and a P-type well region 57 are respectively disposed so as to extend along the alignment direction of the functional cells 52 (and the capacitance fill-cells 54), i.e. in a left and right direction in FIG. 2. Accordingly, the N-type well region 56 and the P-type well region 57 are shared by all the functional cells 52 and the capacitance fill-cells 54 in FIG. 2. Likewise, a power source interconnect portion 58 and a ground interconnect portion 59 are also disposed so as to extend along the alignment direction, and thus shared by all the functional cells 52 and the capacitance fill-cells 54 in FIG. 2.

The capacitor 30 may be employed as a decoupling capacitance provided between the power source and the ground. In this case, a power source potential is applied to the upper electrode 36, and a ground potential is applied to the N-type impurity-implanted region 34 via the N-type impurity diffusion layers 32, 33. Likewise, the capacitor 40 may also be employed as a decoupling capacitance provided between the power source and the ground. In this case, the ground potential is applied to the upper electrode 46, and the power source potential is applied to the P-type impurity-implanted region 44 via the P-type impurity diffusion layers 42, 43. Alternatively, the capacitors 30, 40 may be utilized as a variable capacitance. In this case, changing the potential to be applied to the upper electrodes 36, 46 allows controlling the capacitance to a desired value.

The following passages describe a manufacturing method of the semiconductor integrated circuit 1, as an embodiment of the method of manufacturing a semiconductor integrated circuit according to the present invention. The manufacturing method according to this embodiment is for manufacturing the semiconductor integrated circuit 1 including the semiconductor substrate 90, the N-type FET 10, the P-type FET 20, and the capacitors 30, 40, and includes the following steps (a) to (h).

(a) forming N-type impurity diffusion layers 12, 13 and the P-type impurity diffusion layers 22, 23 in the semiconductor substrate 90;

(b) forming the P-type impurity-implanted region 14 and the N-type impurity-implanted region 24 in the semiconductor substrate 90, adjacent to the N-type impurity diffusion layer 13 and the P-type impurity diffusion layer 23, respectively;

(c) forming the gate insulating layer 15 and the gate insulating layer 25, respectively on the P-type impurity-implanted region 14 and the N-type impurity-implanted region 24 in the semiconductor substrate 90;

(d) forming the gate electrode 16 and the gate electrode 26 on the gate insulating layer 15 and the gate insulating layer 25 respectively;

(e) forming the N-type impurity diffusion layers 32, 33 and the P-type impurity diffusion layers 42, 43 in the semiconductor substrate 90;

(f) forming the N-type impurity-implanted region 34 and the P-type impurity-implanted region 44 in the semiconductor substrate 90, adjacent to the N-type impurity diffusion layer 33 and the P-type impurity diffusion layer 43 respectively;

(g) forming the capacitance insulating layer 35 and the capacitance insulating layer 45 respectively on the N-type impurity-implanted region 34 and the P-type impurity-implanted region 44 in the semiconductor substrate 90; and (h) forming the upper electrode 36 and the upper electrode 46 on the capacitance insulating layer 35 and the capacitance insulating layer 45, respectively.

In this embodiment, the N-type impurity diffusion layer 32 and the N-type impurity diffusion layer 33 are formed with the N-type impurity diffusion layer 12 and the N-type impurity diffusion layer 13 respectively, at a time. Likewise, the P-type impurity diffusion layer 42 and the P-type impurity diffusion layer 43 are formed with the P-type impurity diffusion layer 22 and the P-type impurity diffusion layer 23 respectively, at a time. Also, the N-type impurity-implanted region 34 is formed with the N-type impurity-implanted region 24 at a time. Likewise, the P-type impurity-implanted region 44 is formed with the P-type impurity-implanted region 14 at a time. Further, the gate insulating layer 15, the gate insulating layer 25, the capacitance insulating layer 35, and the capacitance insulating layer 45 are formed at a time. The gate electrode 16, the gate electrode 26, the upper electrode 36 and the upper electrode 46 are also formed at a time. Likewise, the P-type well region 31 and the N-type well region 41 are formed with the P-type well region 11 and the N-type well region 21 respectively, at a time.

In other words, the capacitor 30 shares the process of forming the N-type impurity-implanted region 34 with the P-type FET 20, and the remaining processes with the N-type FET 10. Likewise, the capacitor 40 shares the process of forming the P-type impurity-implanted region 44 with the N-type FET 10, and the remaining processes with the P-type FET 20.

The foregoing embodiment offers the following advantageous effects. In this embodiment, the conductive type of the N-type impurity diffusion layers 32, 33 and that of the N-type impurity-implanted region 34 are the same. Because of such configuration, electrical resistance of a path from the N-type impurity-implanted region 34 to the N-type impurity diffusion layers 32, 33 is smaller, compared with the case where the conductive type is different. Consequently, the capacitor 30 attains superior frequency response. Likewise, since the P-type impurity diffusion layers 42, 43 and the P-type impurity-implanted region 44 are of the same conductive type, the capacitor 40 attains superior frequency response. Thus, according to the foregoing embodiment, the semiconductor integrated circuit 1 attains the capacitors 30, 40 which offer excellent frequency response performance, and the method of manufacturing such semiconductor integrated circuit is also achieved.

Also, in the capacitor 30 the N-type impurity-implanted region 34 serves as the lower electrode. Such configuration allows forming the N-type impurity-implanted region 34 with the N-type impurity-implanted region 24 of the P-type FET 20 at a time. Accordingly, the capacitor 30 which provides excellent frequency response performance can be obtained without any increase in number of manufacturing steps. In this embodiment actually, the N-type impurity-implanted region 24 and the N-type impurity-implanted region 34 are formed at a time, and hence these regions have generally the same impurity concentration profile.

Likewise, in the capacitor 40 also, the P-type impurity-implanted region 44 serves as the lower electrode. Such configuration allows forming the P-type impurity-implanted region 44 with the P-type impurity-implanted region 14 of the N-type FET 10 at a time. Accordingly, the capacitor 40 which provides excellent frequency response performance can be obtained without any increase in number of manufacturing steps. In this embodiment actually, the P-type impurity-implanted region 14 and the P-type impurity-implanted region 44 are formed at a time, and hence these regions have generally the same impurity concentration profile.

The capacitance insulating layers 35, 45 are formed with the gate insulating layer 15, 25 at a time. As a result, the capacitance insulating layers 35, 45 are constituted of the identical material to that of the gate insulating layers 15, 25, and have generally the same thickness as the gate insulating layers 15, 25. Such arrangement suppresses an increase in number of manufacturing steps of the capacitors 30, 40.

The upper electrodes 36, 46 are formed with the gate electrodes 16, 26 at a time. As a result, the upper electrodes 36, 46 are constituted of the identical material to that of the gate electrodes 16, 26, and have generally the same thickness as the gate electrodes 16, 26. Such arrangement suppresses an increase in number of manufacturing steps of the capacitors 30, 40.

Employing the capacitors 30, 40 as a decoupling capacitance allows effectively reducing an Electromagnetic Interference (EMI) noise. Recently, the issue of the Electro Magnetic Compatibility (EMC) has come to be focused on even in designing a system or apparatus, and a printed circuit board. Accordingly, remedies against the EMI are becoming more important in semiconductor integrated circuits such as an LSI. Further, the decoupling capacitance is effective as a remedy against a power source noise (IR-drop) in a chip, not only against the EMI noise.

Especially, employing the capacitors 30, 40 as a fill-cell capacitance enables efficiently utilizing the space on the semiconductor substrate 90, thereby facilitating suppressing the EMI noise without incurring an increase in footprint of the chip.

Second Embodiment

Figure 3:
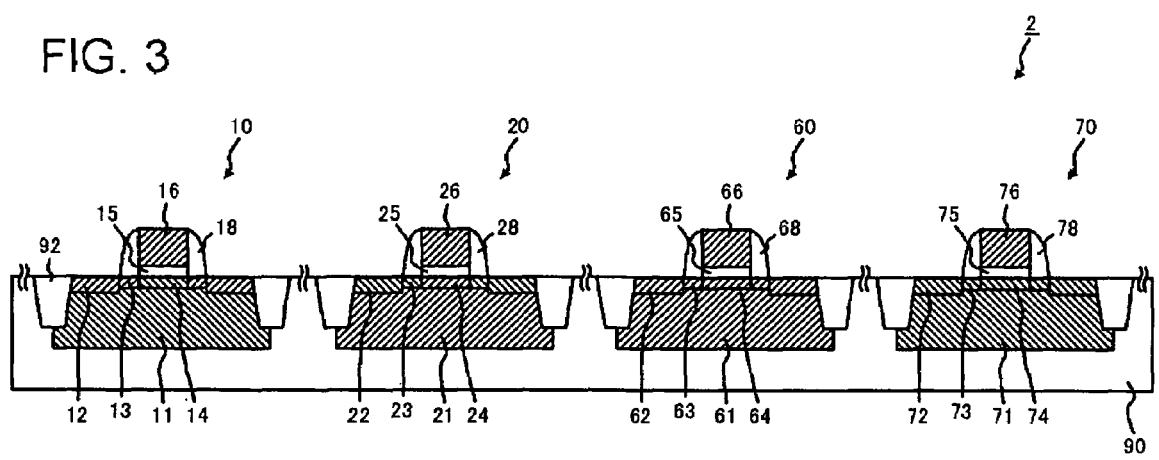
FIG. 3 is a cross-sectional view showing a semiconductor integrated circuit according to a second embodiment of the present invention.

FIG. 3 is a cross-sectional view showing a semiconductor integrated circuit according to a second embodiment of the present invention. The semiconductor integrated circuit 2 includes a semiconductor substrate 90, an N-type FET 10, a P-type FET 20, and capacitors 60, 70. Among these constituents, the semiconductor substrate 90, the N-type FET 10 and the P-type FET 20 are constructed as described referring to FIG. 1.

The capacitor 60 includes N-type impurity diffusion layers 62, 63, an N-type impurity-implanted region 64, a capacitance insulating layer 65, and an upper electrode 66. The N-type impurity diffusion layers 62, 63 are located in the semiconductor substrate-90. The N-type impurity diffusion layers 62, 63 constitute a path for a charge flowing into the N-type impurity-implanted region 64 (or flowing out of the N-type impurity-implanted region 64). In this embodiment, the N-type impurity diffusion layer 62 and the N-type impurity diffusion layer 63 have generally the same impurity concentration profile as the N-type impurity diffusion layer 12 and the N-type impurity diffusion layer 13 of the N-type FET 10, respectively.

In the semiconductor substrate 90, the N-type impurity-implanted region 64 is provided adjacent to the N-type impurity diffusion layer 63. The N-type impurity-implanted region 64 serves as the lower electrode of the capacitor 60. Also, the conductive type of the N-type impurity-implanted region 64 is the same as that of the N-type impurity diffusion layers 62, 63. In this embodiment, the N-type impurity-implanted region 64 has generally the same impurity concentration profile as the N-type impurity-implanted region 24 of the P-type FET 20. The N-type impurity diffusion layers 62, 63 and the N-type impurity-implanted region 64 are located in an N-type well region 61 in the semiconductor substrate 90. Here, the N-type well region 61 may be integrally formed with an N-type well region 21.

On the N-type impurity-implanted region 64 in the semiconductor substrate 90, the capacitance insulating layer 65 is provided. On the capacitance insulating layer 65, the upper electrode 66 is provided. The capacitance insulating layer 65 is constituted of the same material as the gate insulating layers 15, 25. Also, the capacitance insulating layer 65 has generally the same thickness as the gate insulating layers 15, 25. Likewise, the upper electrode 66 is constituted of the same material as the gate electrodes 16, 26. Also, the upper electrode 66 has generally the same thickness as the gate electrodes 16, 26. Further, on a lateral face of the upper electrode 66, a sidewall 68 is provided.

The capacitor 70 includes P-type impurity diffusion layers 72, 73, a P-type impurity-implanted region 74, a capacitance insulating layer 75, and an upper electrode 76. The P-type impurity diffusion layers 72, 73 are located in the semiconductor substrate 90. The P-type impurity diffusion layers 72, 73 constitute a path for a charge flowing into the P-type impurity-implanted region 74 (or flowing out of the P-type impurity-implanted region 74). In this embodiment, the P-type impurity diffusion layer 72 and the P-type impurity diffusion layer 73 have generally the same impurity concentration profile as the P-type impurity diffusion layer 22 and the P-type impurity diffusion layer 23 of the P-type FET 20, respectively.

In the semiconductor substrate 90, the P-type impurity-implanted region 74 is provided adjacent to the P-type impurity diffusion layer 73. The P-type impurity-implanted region 74 serves as the lower electrode of the capacitor 70. Also, the conductive type of the P-type impurity-implanted region 74 is the same as that of the P-type impurity diffusion layers 72, 73. In this embodiment, the P-type impurity-implanted region 74 has generally the same impurity concentration profile as the P-type impurity-implanted region 14 of the N-type FET 10. The P-type impurity diffusion layers 72, 73 and the P-type impurity-implanted region 74 are located in a P-type well region 71 in the semiconductor substrate 90. Here, the P-type well region 71 may be integrally formed with the P-type well region 11.

On the P-type impurity-implanted region 74 in the semiconductor substrate 90, the capacitance insulating layer 75 is provided. On the capacitance insulating layer 75, the upper electrode 76 is provided. The capacitance insulating layer 75 is constituted of the same material as the gate insulating layers 15, 25. Also, the capacitance insulating layer 75 has generally the same thickness as the gate insulating layers 15, 25. Likewise, the upper electrode 76 is constituted of the same material as the gate electrodes 16, 26. Also, the upper electrode 76 has generally the same thickness as the gate electrodes 16, 26. Further, on a lateral face of the upper electrode 76, a sidewall 78 is provided.

Although the N-type impurity diffusion layers 62, 63 are provided on both sides of the N-type impurity-implanted region 64 in the capacitor 60, the N-type impurity diffusion layers 62, 63 on one of the sides are electrically connected to the N-type impurity diffusion layers 62, 63 on the other side, via an interconnect or the like not shown in FIG. 3. This is also the case with the P-type impurity diffusion layers 72, 73 in the capacitor 70. The N-type FET 10, the P-type FET 20, the capacitor 60 and the capacitor 70 are isolated from one another by an isolation region 92.

The semiconductor integrated circuit 2 thus constructed may be manufactured through similar processes to those for the semiconductor integrated circuit 1 shown in FIG. 1. In other words, the capacitor 60 may share the process of forming the N-type impurity diffusion layers 62, 63 with the N-type FET 10, and the remaining processes with the P-type FET 20. Likewise, the capacitor 70 may share the process of forming the P-type impurity diffusion layers 72, 73 with the P-type FET 20, and the remaining processes with the N-type FET 10.

The foregoing embodiment offers the following advantageous effects. In this embodiment, the conductive type of the N-type impurity diffusion layers 62, 63 and that of the N-type impurity-implanted region 64 are the same. Because of such configuration, electrical resistance of a path from the N-type impurity-implanted region 64 to the N-type impurity diffusion layers 62, 63 is smaller, compared with the case where the conductive type is different. Consequently, the capacitor 60 attains superior frequency response. Likewise, since the P-type impurity diffusion layers 72, 73 and the P-type impurity-implanted region 74 are of the same conductive type, the capacitor 70 attains superior frequency response. Thus, according to the foregoing embodiment, the semiconductor integrated circuit 2 attains the capacitors 60, 70 which offer excellent frequency response performance, and the method of manufacturing such semiconductor integrated circuit is also achieved.

Also, in the capacitor 60, the N-type impurity diffusion layers 62, 63 can be formed with the N-type impurity diffusion layer 12, 13 of the N-type FET 10 at a time. Accordingly, the capacitor 60 which provides excellent frequency response performance can be obtained without any increase in number of manufacturing steps. In this embodiment actually, the N-type impurity diffusion layer 12 and the N-type impurity diffusion layer 62 are formed at a time, and hence these regions have generally the same impurity concentration profile. The N-type impurity diffusion layer 13 and the N-type impurity diffusion layer 63 are also formed at a time, and hence these layers have generally the same impurity concentration profile.

Likewise, in the capacitor 70 also, the P-type impurity diffusion layers 72, 73 can be formed with the P-type impurity diffusion layers 22, 23 of the P-type FET 20 at a time. Accordingly, the capacitor 70 which provides excellent frequency response performance can be obtained without any increase in number of manufacturing steps. In this embodiment actually, the P-type impurity diffusion layer 22 and the P-type impurity diffusion layer 72 are formed at a time, and hence these regions have generally the same impurity concentration profile. The P-type impurity diffusion layer 23 and the P-type impurity diffusion layer 73 are also formed at a time, and hence these layers have generally the same impurity concentration profile.

Further, in this embodiment, the conductive type of the N-type well region 61 is the same as that of the N-type impurity diffusion layers 62, 63 and the N-type impurity-implanted region 64. Because of such configuration, the electrical resistance of the path from the N-type impurity-implanted region 64 to the N-type impurity diffusion layers 62, 63 becomes still smaller. Likewise, since the P-type impurity diffusion layers 72, 73 and the P-type impurity-implanted region 74 are of the same conductive type, the electrical resistance of the path from the P-type impurity-implanted region 74 to the P-type impurity diffusion layers 72, 73 becomes still smaller.

The semiconductor integrated circuit and the method of manufacturing the same according to the present invention are not limited to the foregoing embodiments, but various modifications may be made. To cite a few examples, although the embodiments describe the integrated circuits including two types of capacitors, just one type of capacitor may be provided. More specifically, the semiconductor integrated circuit 1 shown in FIG. 1 may include only either of the capacitor 30 or the capacitor 40. Likewise, the semiconductor integrated circuit 2 shown in FIG. 3 may include only either of the capacitor 60 or the capacitor 70.

Also, although in the capacitor 30 the conductive type of the N-type impurity diffusion layer 33 is assumed to be the same as that of the N-type impurity diffusion layer 32 according to the embodiments, the conductive type of the N-type impurity diffusion layer 33 may be opposite to that of the N-type impurity diffusion layer 32 (and the N-type impurity-implanted region 34), as long as the N-type impurity diffusion layer 32 and the N-type impurity-implanted region 34 are of the same conductive type. This also applies to the capacitors 40, 60, 70.

Figure 4:
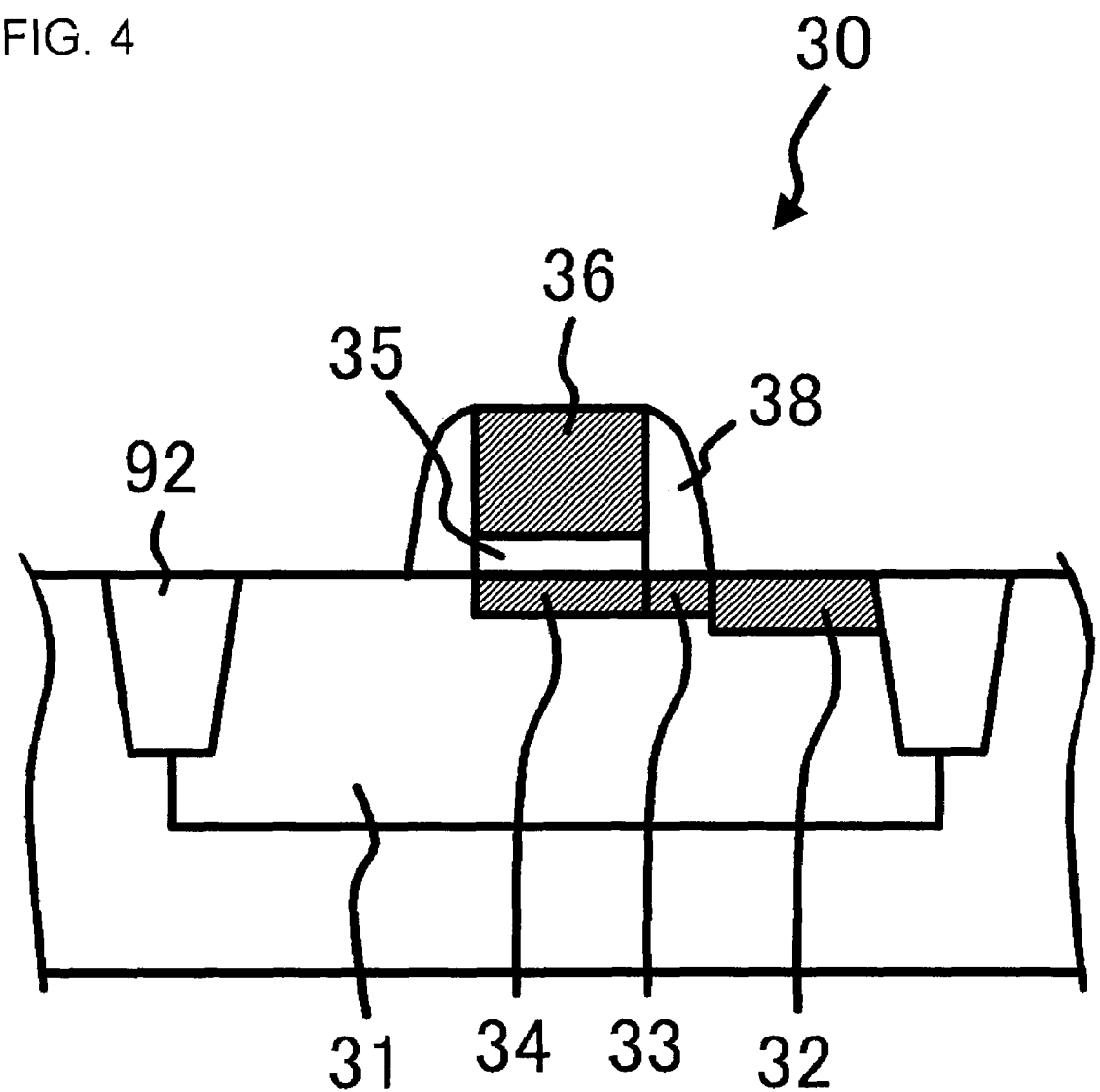
FIG. 4 is a cross-sectional view showing a variation of the capacitor according to the embodiment.
Figure 5:
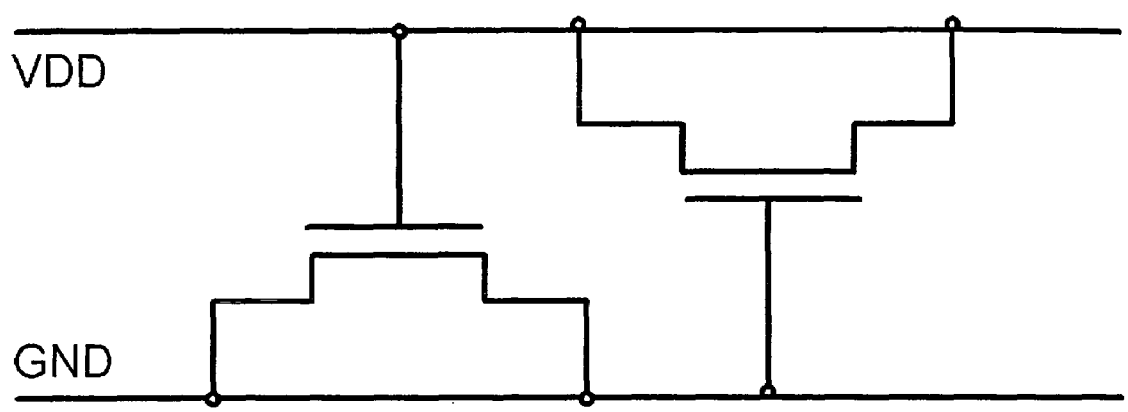
FIG. 5 is a circuit diagram of a decoupling capacitance constituted of a FET.

Further, although in the capacitor 30 the N-type impurity diffusion layers 32, 33 are provided on both sides of the N-type impurity-implanted region 34 according to the embodiments, the N-type impurity diffusion layers 32, 33 may only be provided on either side of the N-type impurity-implanted region 34 as shown in FIG. 4. This also applies to the capacitors 40, 60, 70.

It is apparent that the present invention is not limited to the above embodiment, and may be modified and changed without departing from the scope and spirit of the invention.

What is claimed is:

1. A semiconductor integrated circuit, comprising:
a semiconductor substrate, a field effect transistor, and a capacitor;
wherein the field effect transistor includes:
a first impurity diffusion layer of a first conductive type provided in the semiconductor substrate and acting as a source/drain region,
a first impurity-implanted region of a second conductive type provided in the semiconductor substrate and adjacent to the first impurity diffusion layer, and acting as a channel region, a gate insulating layer provided on the first impurity-implanted region in the semiconductor substrate, and
a gate electrode provided on the gate insulating layer; and
the capacitor includes:
a second impurity diffusion layer of the first or the second conductive type provided in the semiconductor substrate,
a second impurity-implanted region of the same conductive type as the second impurity diffusion layer, provided in the semiconductor substrate and adjacent to the second impurity diffusion layer, and acting as a lower electrode,
a capacitance insulating layer provided on the second impurity-implanted region of the semiconductor substrate, and
an upper electrode provided on the capacitance insulating layer.

2. The semiconductor integrated circuit according to claim 1,
wherein said second impurity diffusion layer and said second impurity-implanted region are located in a well region provided in said semiconductor substrate; and
said well region is of the same conductive type as said second impurity diffusion layer.

3. The semiconductor integrated circuit according to claim 1,
wherein a conductive type of said second impurity diffusion layer is said first conductive type; and
said second impurity diffusion layer has generally the same impurity concentration profile as said first impurity diffusion layer.

4. The semiconductor integrated circuit according to claim 1,
wherein a conductive type of said second impurity diffusion layer is said second conductive type; and
said second impurity-implanted region has generally the same impurity concentration profile as said first impurity-implanted region.

5. The semiconductor integrated circuit according to claim 1,
wherein said capacitance insulating layer is constituted of an identical material to said gate insulating layer; and
said capacitance insulating layer has generally the same thickness as said gate insulating layer.

6. The semiconductor integrated circuit according to claim 1,
wherein said upper electrode is constituted of an identical material to said gate electrode; and
said upper electrode has generally the same thickness as said gate electrode.

7. The semiconductor integrated circuit according to claim 1,
wherein said capacitor is a decoupling capacitance provided between a power source and a ground.

8. The semiconductor integrated circuit according to claim 7,
wherein said capacitor is a fill-cell capacitance.

9. The semiconductor integrated circuit according to claim 1,
wherein said capacitor has a variable capacitance.

10. A method of manufacturing a semiconductor integrated circuit including a semiconductor substrate, a field effect transistor and a capacitor, comprising:
forming a first impurity diffusion layer of a first conductive type in the semiconductor substrate, thus constituting a source/drain region;
forming a first impurity-implanted region of a second conductive type in the semiconductor substrate and adjacent to the first impurity diffusion layer, thus constituting a channel region;
forming a gate insulating layer on the first impurity-implanted region in the semiconductor substrate;
forming a gate electrode on the gate insulating layer;
forming a second impurity diffusion layer of the first or the second conductive type in the semiconductor substrate;
forming a second impurity-implanted region of the same conductive type as the second impurity diffusion layer, in the semiconductor substrate and adjacent to the second impurity diffusion layer, thus constituting a lower electrode;
forming a capacitance insulating layer on the second impurity-implanted region of the semiconductor substrate; and
forming an upper electrode on the capacitance insulating layer.

11. The method according to claim 10,
wherein said forming a second impurity diffusion layer includes forming said second impurity diffusion layer in said first conductive type; and
said forming a first impurity diffusion layer and said forming a second impurity diffusion layer are executed at a time.

12. The method according to claim 10,
wherein said forming a second impurity diffusion layer includes forming said second impurity diffusion layer in said second conductive type; and
said forming a first impurity-implanted region and said forming a second impurity-implanted region are executed at a time.

13. The method according to claim 10,
wherein said forming a gate insulating layer and said forming a capacitance insulating layer are executed at a time.

14. The method according to claim 10,
wherein said forming a gate electrode and said forming an upper electrode are executed at a time.

* * * * *